United States Patent [19]
Tiede et al.

[11] Patent Number: 5,900,021
[45] Date of Patent: May 4, 1999

[54] PAD INPUT SELECT CIRCUIT FOR USE WITH BOND OPTIONS

[75] Inventors: John William Tiede; Jon Allan Faue, both of Colorado Springs, Colo.

[73] Assignees: United Memories, Inc., Colorado Springs; Nippon Steel Semiconductor Corporation, Chiba, Japan

[21] Appl. No.: 08/833,105

[22] Filed: Apr. 4, 1997

[51] Int. Cl.⁶ .............................. G06F 12/00; G11C 7/00
[52] U.S. Cl. ................ 711/170; 365/189.02; 365/230.02
[58] Field of Search ........................ 711/170; 365/189.02, 365/230.02; 395/653

[56] References Cited

U.S. PATENT DOCUMENTS

| | | |
|---|---|---|
| 4,551,634 | 11/1985 | Takahashi et al. . |
| 4,825,099 | 4/1989 | Barton ..................................... 307/270 |
| 5,373,470 | 12/1994 | Jones, Jr. ............................ 365/189.05 |
| 5,406,525 | 4/1995 | Nicholes . |
| 5,572,718 | 11/1996 | Scriber et al. . |
| 5,600,271 | 2/1997 | Erickson et al. .......................... 327/108 |
| 5,706,235 | 1/1998 | Roohparvar et al. .................... 365/201 |
| 5,757,704 | 5/1998 | Hachiya ............................... 365/189.02 |

FOREIGN PATENT DOCUMENTS

| | | |
|---|---|---|
| 0 198 429 A2 | 10/1986 | European Pat. Off. . |
| 0 513 968 A2 | 11/1992 | European Pat. Off. . |
| 2 271 449 | 4/1994 | United Kingdom . |

Primary Examiner—Tod R. Swann
Assistant Examiner—Tuan V. Thai
Attorney, Agent, or Firm—Richard A. Bachand; Stuart T. Langley; Holland & Hart llp

[57] ABSTRACT

A configurable input device for an integrated circuit having a plurality of input pads, the input device including a plurality of buffers, where each buffer is associated with one of the input pads. Each buffer receives a mode select signal and the buffer is responsive to the mode select signal to place the buffer in an enabled mode or a disabled mode. A receiver portion within each buffer is coupled to the associated input pad. The receiver portion pulls the associated input pad to a preselected logic state while the buffer is in the disabled mode. An output driver within each buffer generates an output signal responsive to a signal on the associated input pad while the buffer is in the enable mode and provides a high impedance while the buffer is in the disabled mode. An output node is coupled to the output drivers of the plurality of buffers.

18 Claims, 5 Drawing Sheets

PAD INPUT SELECT CIRCUIT FOR USE WITH BOND OPTIONS

BACKGROUND OF THE INVENTION

1. Field of the Invention

The present invention relates, in general, to semiconductor integrated circuits, and, more particularly, to a circuit for configuring input devices in an integrated circuit.

2. Relevant Background

In the production and manufacturing of different types of integrated circuits (ICs) it is desirable to have a single IC that can be packaged to operate with different interfaces. For example, a random access memory (RAM) may be configured as a "by-16" device or a "by-8" device. When configured as a by-16 device, the RAM receives sixteen data bits at sixteen data input/output (I/O) pins. These input data bits represent a single 16-bit word that is stored in the RAM at a location determined by address bits received at the address pins. In a by-8 device only eight bits of data are input to the RAM at one time.

For a given memory size (e.g., a 4 megabyte (MB) dynamic random access memory (DRAM)) much of the internal circuitry of a by-16 device can be identical to that of a by-8 device. However, the external control and data signals that are applied to the device differ between the two configurations. For example, a 4 MB by-16 device is typically packaged in a 40-pin plastic small outline J-lead (SOJ) or a 44-pin thin, small-outline package (TSOP) to provide an adequate number of pins for the 16-bit wide data bus. A 4 MB by-8 device, however, is typically packaged in a 28-pin SOG or 28-pin TSOP package. With respect to control signals, a by-16 device may require two column address strobe (CAS) signals or two write enable (WE) signals to separately activate columns in lower and upper memory banks within the chip. In contrast, a by-8 device uses a single CAS and WE signal, together with an additional address bit, to access data stored in both the upper and lower banks.

In spite of the great similarity between by-16 and by-8 devices from the standpoint of internal circuitry, most manufacturers must produce two separate IC designs to account for the different pin-outs and control signals. A by-16 device may be realized as an entirely different chip design and layout from the by-8 device, or the chips may differ only by customization of one or more metal layers. In either case, a particular chip must be committed to a by-8 or a by-16 design during the wafer fabrication process.

From a manufacturing efficiency standpoint, it is desirable to fabricate multiple device configurations using a single integrated circuit design. Not only is design time used more efficiently, but a single chip design simplifies scheduling and work flow in a wafer fabrication facility. Because the semiconductor fabrication process takes several weeks to process raw substrates into packaged electronic devices, a great deal of effort is placed in predicting customer orders so that finished goods are available when customers demand. For these reasons, it is desirable to be able to select the configuration of a semiconductor device as late as possible in the manufacturing process.

Many configurable circuits are available that allow the end-user to change the configuration after the manufacturing process is completed. Examples include field programmable gate arrays (FPGAs) and programmable logic devices (PLDs). However, these circuits tend to be cost prohibitive except for specialized applications. In cost sensitive markets such as exists for memory devices, user-configurable circuits are usually impractical. What is needed is a configurable input circuit that allows configuration to be chosen late in the manufacturing process, preferably during the assembly and packaging stages.

Semiconductor devices are manufactured to meet industry standards for functionality and performance. These standards dictate the packaging and pin-out configuration of most semiconductor devices. This standardization allows commodity devices supplied by one manufacturer to be substituted for those of another manufacturer. Any internal circuitry used to enable configurability must be implemented in a manner that allows compliance with industry standards, and does not adversely impact device functionality, performance and reliability.

SUMMARY OF THE INVENTION

Briefly stated, the present invention involves a configurable input device for an integrated circuit having a plurality of input pads, the input device including a plurality of buffers, where each buffer is associated with one of the input pads. Each buffer receives a mode select signal and the buffer is responsive to the mode select signal to place the buffer in an enabled mode or a disabled mode. A receiver portion within each buffer is coupled to the associated input pad. The receiver portion pulls the associated input pad to a preselected logic state while the buffer is in the disabled mode. An output driver within each buffer generates an output signal responsive to a signal on the associated input pad while the buffer is in the enable mode and provides a high impedance while the buffer is in the disabled mode. An output node is coupled to the output drivers of the plurality of buffers.

In another aspect, the present invention involves a method for configurably coupling an input pad to an internal circuit node of an integrated circuit. In accordance with the method a mode select signal is provided on a mode select node. A selected one of the plurality of input pads is coupled to an internal circuit node in response to the mode select signal. A pull-down device is controlled to pull the unselected input pads to a first logical state in response to the mode select signal.

DETAILED DESCRIPTION OF THE PREFERRED EMBODIMENTS

Typically, an input pad is coupled to a buffer circuit that may latch, invert, or simply buffer a signal on the input pad.

The output of the buffer is then coupled through an internal circuit node to additional logic on the integrated circuit (IC). Often, the buffer output is gated by a power gating signal that is generated by internal circuitry on the IC. This gating allows the input pads to be decoupled from the internal circuitry to prevent conflicts that may interfere with circuit performance. Gating is optional.

As used herein, the term "configurable ICs" means devices that can be configured during manufacturing to operate in one of several selected modes. The term is not intended to include programmable logic or user configurable logic such as programmable gate arrays unless such devices also include configuration options that are fixed during manufacturing. Specifically, the present invention is directed to configuration options that are selected during the packaging process by, for example, bond wire options.

Using bond options configuration, a mode select signal can be permanently provided to the IC by selectively bonding mode configuration pads to ground or power busses. Combinatorial logic coupled to the mode configuration pads generates internal configuration signals that enable and/or disable portions of the internal circuitry to realize a desired configuration option. Because the mode select signals are chosen by permanent bonds, the configuration cannot be changed after packaging. However, bonding occurs very late in the IC manufacturing process and allows great flexibility to select the final device configuration to meet customer demand just before completing manufacturing.

Figure 1:
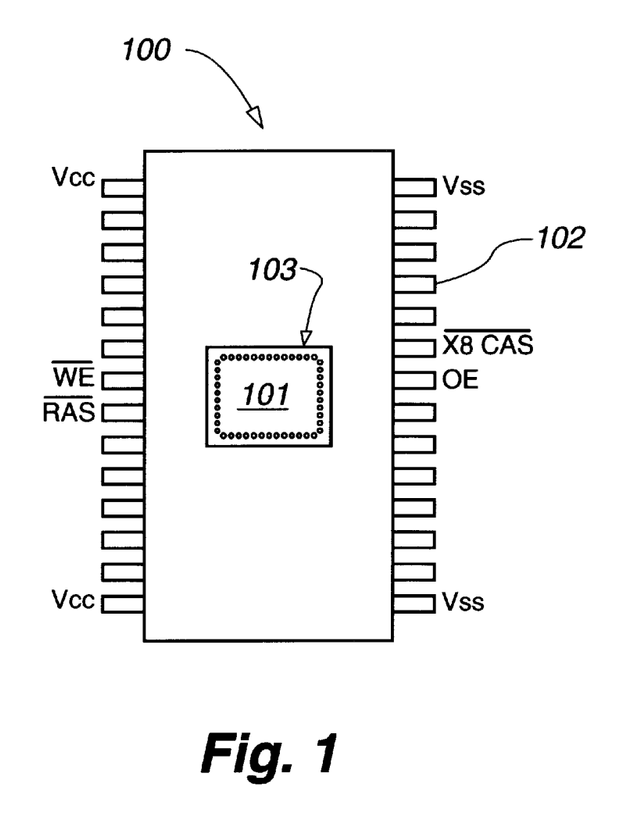
FIG. 1 shows in outline form a representation of a first implementation of a memory circuit embodying the present invention.
Figure 2:
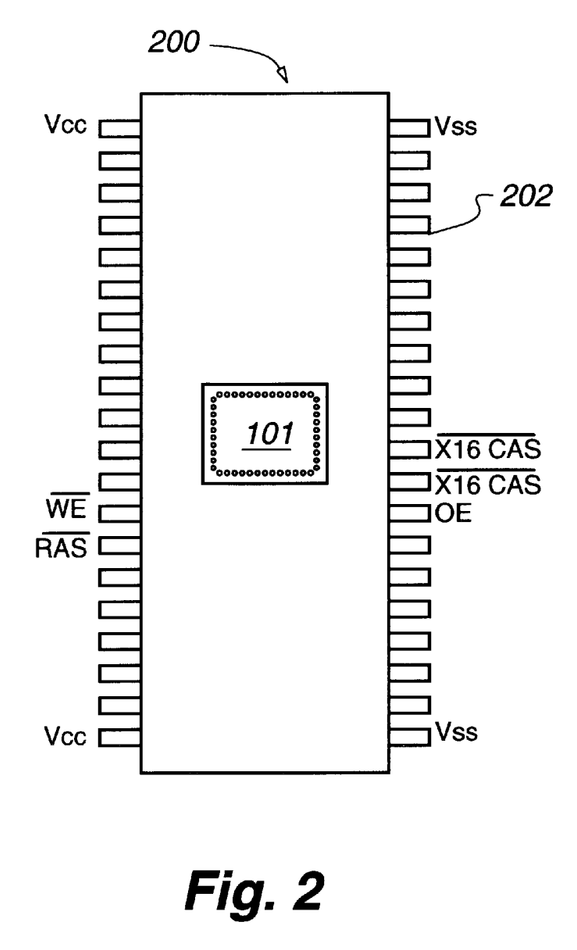
FIG. 2 shows in outline form a representation of a second implementation of the memory circuit in accordance with the present invention.

Bond options are an increasingly important feature in many modern semiconductor devices, especially memory devices. By tying a configuration pad high or low it is possible to change the entire configuration of an IC. For example, a 4 MB DRAM can be organized as a 512K×8 device (i.e., a "by-8" device shown in FIG. 1) or as a 256K×16 device (i.e., a "by-16" device shown in FIG. 2) depending on the state of the configuration pad. In accordance with the present invention, the same chip 101 can be used in either the configuration of FIG. 1 or FIG. 2. IC 101 is not configured until bonds coupling pads 103 to device pins 102 and 202 are formed.

Because bond options or mode configuration options are available on IC 101, the exact input pad 103 from which a control or data signal may come may change depending on the configuration. For example, by-16 device 200 receives active-low upper CAS (labeled UCAS) and active-low lower CAS (labeled LCAS) control signals while by-8 device 100 requires only one CAS signal. As used herein, a signal identifier designated with a bar indicates an active low signal, while the absence of a bar indicates an active high signal. Input circuit 301 (shown in FIG. 3) in accordance with the present invention steers the correct input pad 103 to the internal circuit path where it is required. This allows various internal circuitry and circuit paths to function the same regardless of the mode specified by the bond option. Preferably, all of the unused input pads 103 are disabled.

Figure 3:
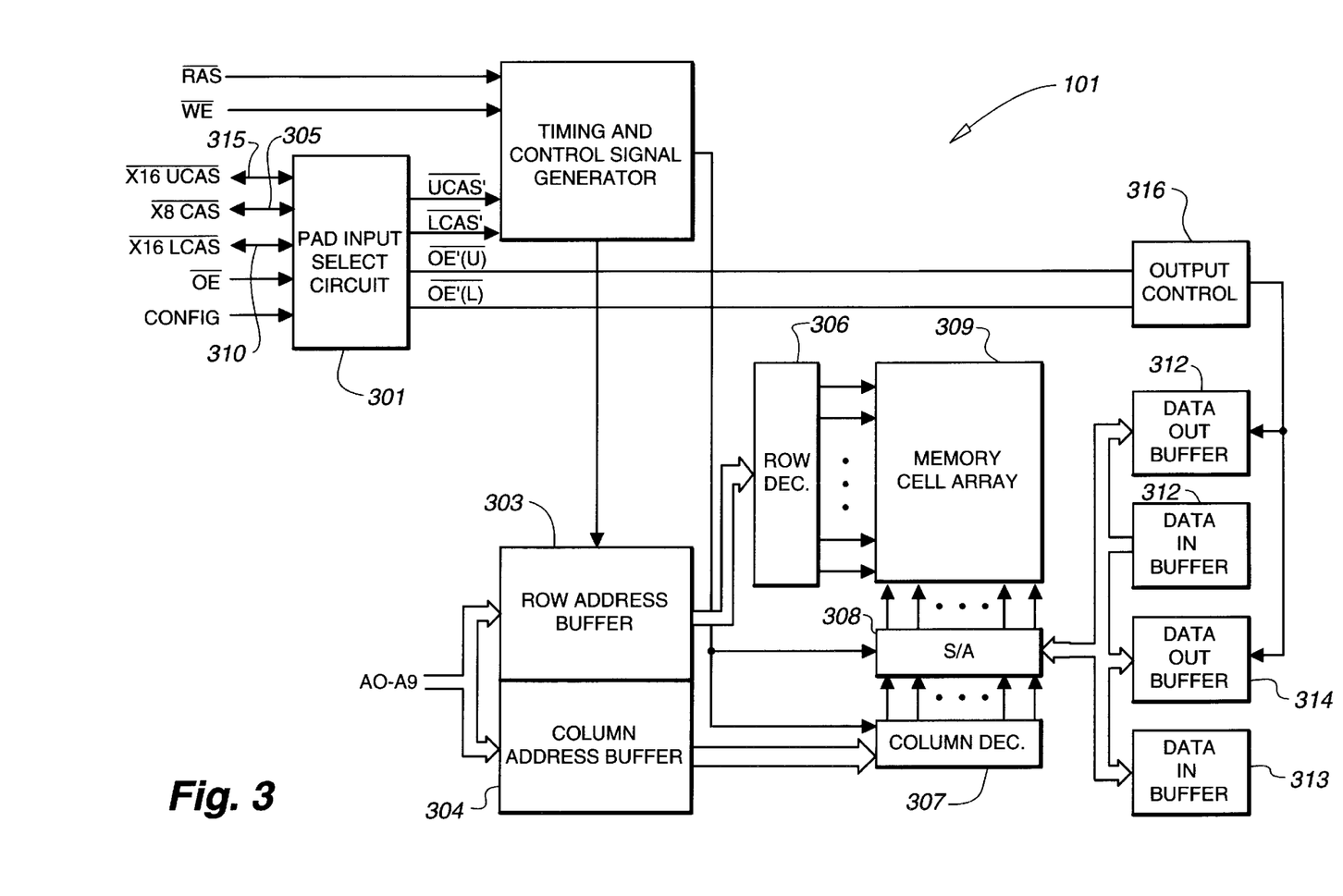
FIG. 3 shows in block diagram form a memory circuit embodying an pad input select circuit in accordance with the present invention.

FIG. 3 shows an exemplary IC 101 incorporating a pad input select circuit 301 in accordance with the present invention. In the particular example, IC 101 is a 4 MB DRAM circuit that is configurable as a by-8 or a by-16 device. The configuration of IC 101 is accomplished by setting the signal level on the configuration pad (labeled CONFIG) to select circuit 301. The preferred technique for setting the voltage level is to bond the CONFIG pad to either the VCC or the VSS power supply bus.

A single CONFIG pad with a binary signal level will allow pad input select circuit 301 to select between two configuration options. If more configuration options are desired, multiple binary CONFIG pads can be provided. In cases where only one CONFIG pad is used, the signal on the CONFIG pad can be used directly as a mode select signal in pad input select circuit 301. In cases where multiple CONFIG pads are used, pad input select circuit will require additional combinatorial logic (not shown) to generate one or more mode select signals having desired properties to meet the needs of a particular application. Design and implementation of the combinatorial logic can be accomplished using available logic design techniques.

Pad input select circuit 301 receives the active-low output enable (OE) signal, the active-low by-16 lower column address strobe (X16 LCAS on node 310), the active-low by-16 upper column address strobe (X16 UCAS on node 315) and the active-low by-8 column address strobe (X8 CAS on node 305) signals. Pad input select circuit 301 serves to select one of the X16 UCAS and X8 CAS signals to couple as the modified active-low upper column address strobe (UCAS') signal to timing and control signal generator 302. Also, pad input select circuit 301 serves to select one of the X16 LCAS and X8 CAS signals to couple as the modified active-low lower column address strobe (LCAS') signal to timing and control signal generator 302. Pad input select circuit 301 also generates one or more modified active-low output enable signals such as OE' (L) and OE' (U) to output control circuit 316 in the preferred implementation.

Control signal generator 302 receives two active-low column address strobe signals as expected by a convention control signal generator used in a by-16 device. IC 101 has three input pads supporting CAS signals, of which only one or two are used for any selected configuration. A first of the column address strobe inputs is selected from either the input pad coupled to node 305 or the input pad coupled to node 310 by input pad selector 301. A second of the column address strobe inputs is selected from either the input pad coupled to node 305 or the input pad coupled to node 315 by input pad selector 301. In accordance with the present invention, the unused input pad(s) are pulled to a selected power supply voltage to avoid problems associated with "floating" input pads.

To configure IC 101 as a by-8 device, the input pad coupled to node 305 is bonded to the CAS input pin of the industry standard package (e.g., a 28-pin SOJ package). The mode select input is bonded to indicate a by-8 configuration causing pad input select circuit 301 to select the input pad coupled to node 305 as both the LCAS' and UCAS' outputs. Hence, when configured as a by-8 device, both CAS inputs to control signal generator 302 come from the single CAS provided by the industry standard by-8 package.

To configure IC 101 as a by-16 device, the input pad coupled to node 310 is coupled to X16 LCAS and the input pad coupled to node 315 is coupled to X16 UCAS. The mode select input is bonded to indicate a by-16 configuration causing pad input select circuit 301 to select the input pad coupled to node 310 as the LCAS' output and the input pad coupled to node 315 as the UCAS' output. Hence, when configured as a by-16 device, the CAS inputs to control signal generator 302 come from the dual CAS pins provided by the industry standard by-16 package (e.g., a 40 pin SOJ package).

Pad input select circuit 301 also generates active-low upper and lower output enable signals OE' (L) and OE' (U) coupled to output control circuit 316. In a conventional by-16 design, two output enable signals are used to independently enable data output buffers 312 and 314.

In this manner, pad input select circuit 301 in accordance with the present invention enables the remainder of the circuitry shown in FIG. 3 to be substantially identical to a conventional by-16 memory device. Pad input select circuit 301 generates the expected signals for a by-16 device so that downstream circuitry that is responsive to pad inputs need not be modified in order to function properly as either a by-8 or a by-16 configured memory circuit. Timing and control signal generator 302 generates required timing signals to row address buffer 303 and column address buffer 304 to load address information A0–A9. For a by-8 device, all of A0–A9 are used, whereas for a by-16 device, A0–A8 are used. Invention does not impact or change column and row address method.

Row address buffer 303 and column address buffer 304 couple to row decoder 306 and column decoder 307 respectively in a conventional manner. Row decoder 306 outputs row select signals to memory cell array 309 and column decoder 307 outputs column select signals to sense amplifier array 308 in a conventional manner. Sense amplifier array 308 drives column lines within memory cell array 309 in a conventional manner. Together, row decoder 306, column decoder 307, and sense amplifier array 308 select a desired address space within memory cell array 309 for read and write operations. Data is coupled through sense amplifier array 308 from data in and data out buffers 311, 312, 313 and 314 in a conventional manner. U.S. Pat. No. 5,373,470 describes several circuits suitable for implementation of data I/O circuits buffers 311–314 that are capable of configurably steering data signals to/from appropriate output pins in either a by-8 or by-16 configuration.

Figure 4:
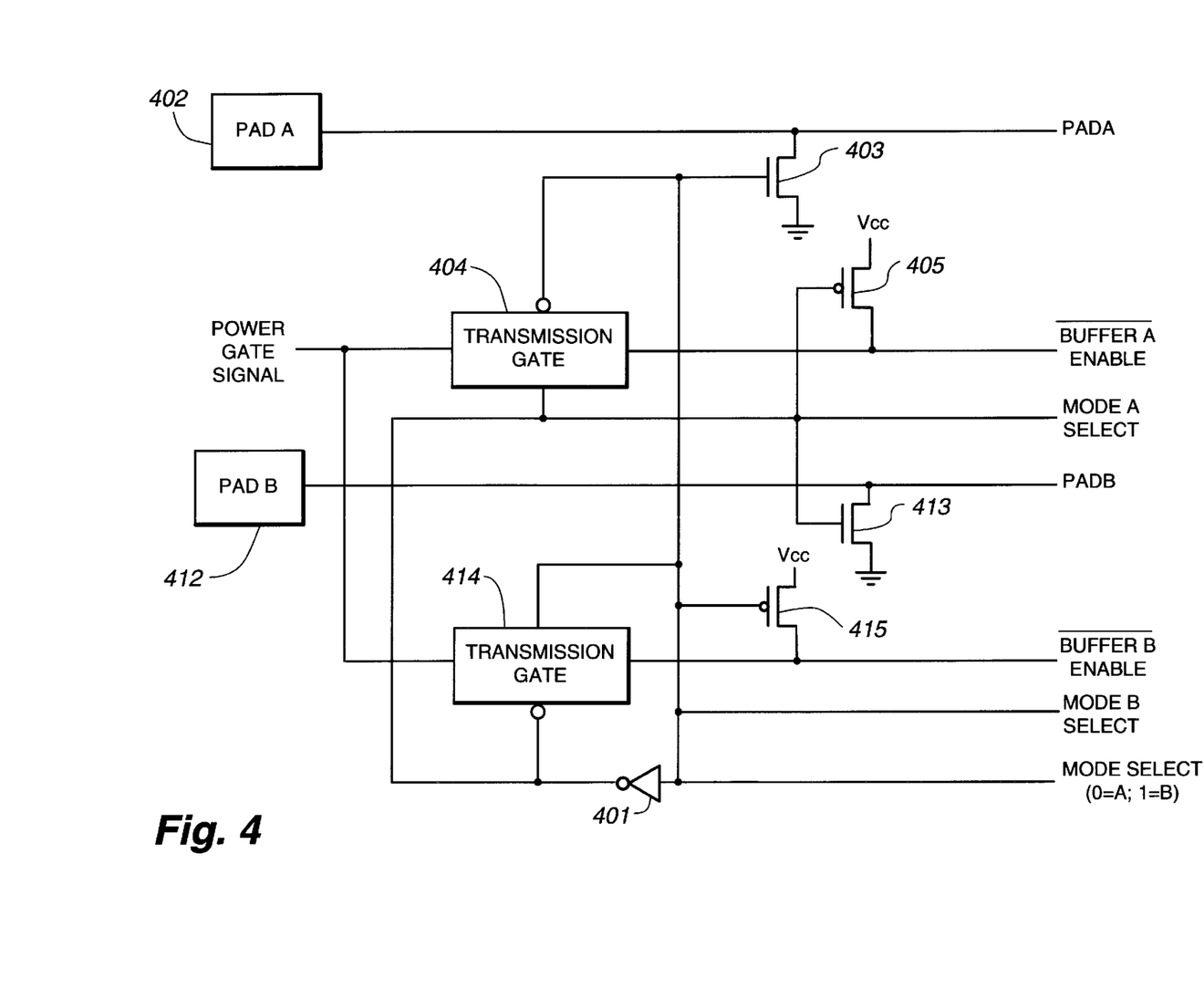
FIG. 4 shows in block diagram form a first portion of a generic implementation of a configurable input circuit in accordance with the present invention.
Figure 5:
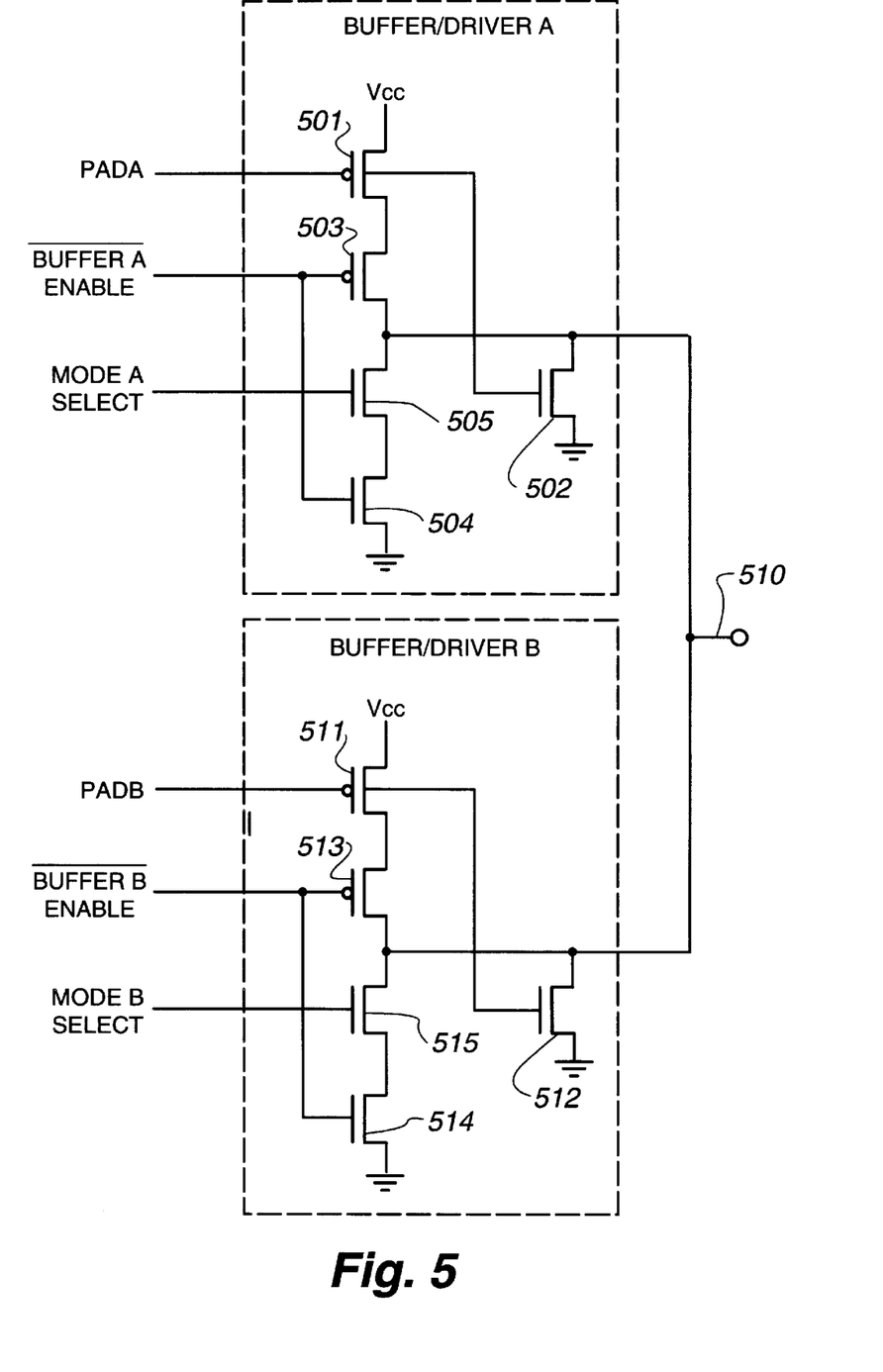
FIG. 5 illustrates in block diagram form a second portion of the generic implementation of the configurable input circuit in accordance with the present invention.
Figure 6:
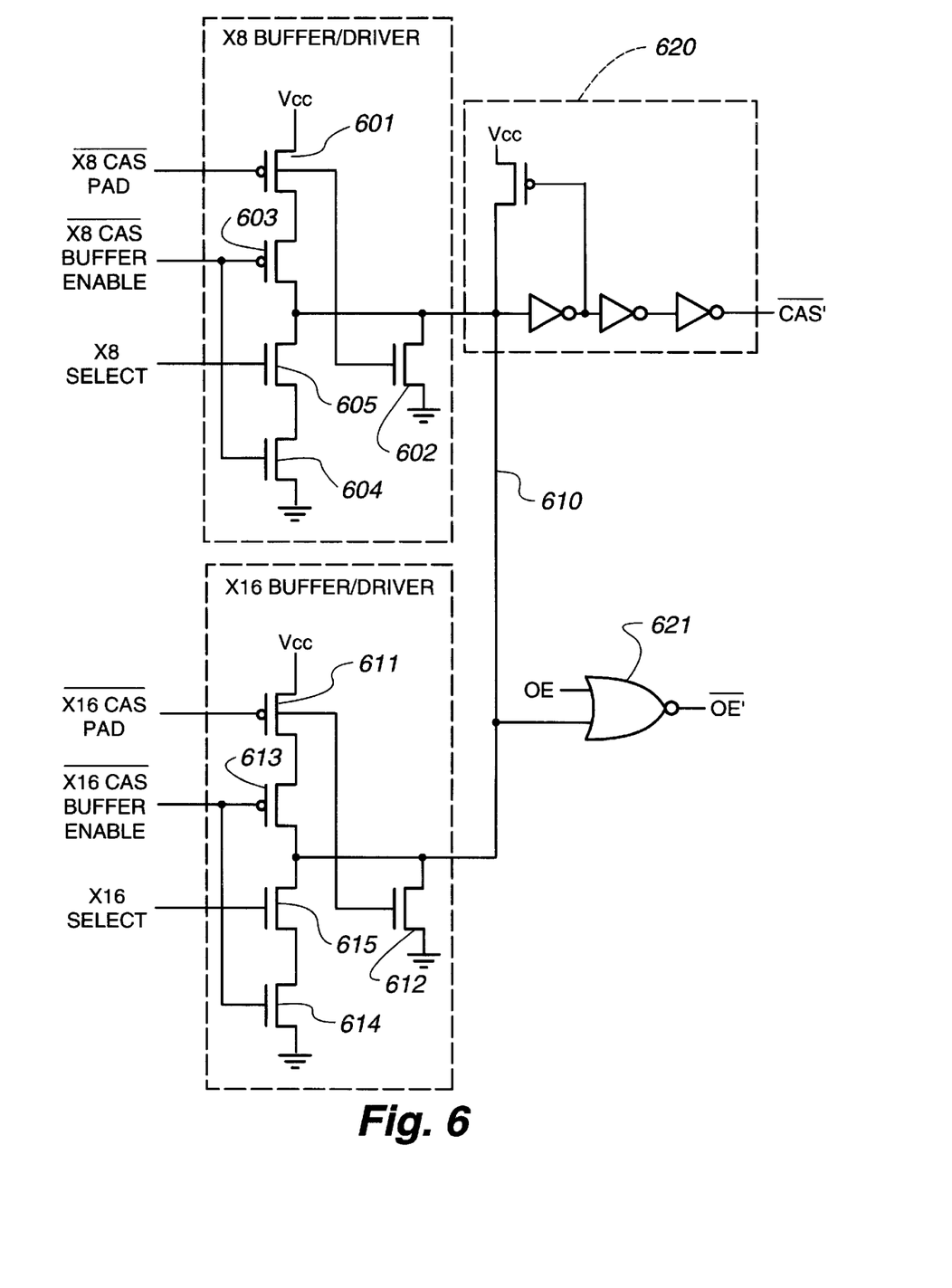
FIG. 6 illustrates a particular embodiment of the present invention in a memory device.

FIG. 4 shows in block diagram form a first portion of pad input select circuit 301 in accordance with the present invention. FIG. 4 represents a receiver portion of the input pad select circuit 301 while FIG. 5 represents a buffer and output driver portion of input pad select circuit 301. It should be understood that FIG. 4 and FIG. 5 show a general implementation in accordance with the present invention while FIG. 6 shows a specific implementation useful in the memory circuit shown in FIG. 3.

In FIG. 4, a mode select signal such as the CONFIG signal shown in FIG. 3 is applied to inverter 401 to generate an inverted mode select signal on the MODE A SELECT line. The mode select signal is coupled directly to the MODE B SELECT line. In the examples herein, each device has two configurable modes that can be adequately identified by a single bit binary mode select signal and the complementary MODE A SELECT and MODE B SELECT lines. Where the modes are complementary, the only combinatorial logic required can be supplied by inverter 401. The present invention is also useful to select one input pad from among three or more input pads, however. In these cases, more complex combinatorial logic could be used in place of inverter 401 to generate multiple MODE SELECT signals such that only one input pad is selected.

Pad A is coupled to a source/drain terminal of pull-down transistor 403. In the preferred embodiment, pull-down transistor 403 comprises an n-channel transistor having a second source/drain terminal coupled to a logic level voltage supplied by $V_{ss}$ or ground. The gate of transistor 403 is controlled by the mode select signal such that when the mode select signal is a logic high, transistor 403 is activated, and input pad A as well as the PADA signal are pulled to logic low or ground. In this manner when the mode select signal is bonded to the $V_{cc}$ power supply, input pad A is disabled and pulled to a logic low. When the mode select signal is bonded to the ground or $V_{ss}$ power supply, transistor 403 is off and the PADA signal is passed from the input pad A to the circuitry shown in FIG. 5. This feature of the present invention ensures that the unselected input pad is tied to a fixed power supply voltage and not left floating.

As shown in FIG. 4, it is preferable that pull-down device 403 is implemented as an N-channel transistor such that the unselected input pad is pulled to ground. Alternatively, pull-down transistor 403 could be replaced by a p-channel pull-up transistor (not shown) to pull the unselected pad to a logic high (i.e., $V_{cc}$). However, in a CMOS circuit built on a charge pumped p-type substrate, p-channel source/drain nodes form one terminal of a parasitic four layer PNPN structure that has a greater tendency to latch up than does the source/drain of an n-channel device built in the same circuit. It is recommended that input pads, which are more likely to experience transients than internal circuitry, be coupled directly to only N-channel device S/D to avoid latch up. However, in some applications p-channel pull-up devices may be adequate in which case they are equivalent to the preferred embodiment disclosed herein.

Preferably, input pad select circuit 301 also includes power gating circuitry to generate an active-low BUFFER A ENABLE control signal used by the circuitry shown in FIG. 5. Transmission gate 404 is responsive to the MODE B SELECT signal and the MODE A SELECT signal to pass the power gate signal when the MODE SELECT signal is a logic high and block the power gate signal when the MODE SELECT signal is a logic low. Also, transistor 405 is coupled to the MODE A SELECT signal to such that while the MODE B SELECT signal is a logic low (i.e., the MODE SELECT signal is a logic high) transistor 405 is on and the BUFFER A ENABLE is tied to the $V_{cc}$ power supply.

This configuration places the BUFFER A ENABLE signal in a permanently disabled state when the MODE SELECT signal is a logic high. Also, this configuration places the BUFFER A ENABLE under control of the power gate signal when the MODE SELECT signal is a logic low.

The receiver circuitry coupled to pad B at node 412 is substantially identical to the circuitry described above with respect to pad A at node 402. However, a gate of pull down device 413 is controlled by the BUFFER A ENABLE line to pull pad B to the logic low voltage while mode A is selected. Transmission gate 414 passes the power gate signal to the active-low buffer B enable line (BUFFER B ENABLE) while mode B is high, and transistor 415 is off while the MODE B SELECT signal is a logic high. In a complementary fashion, transmission gate 414 blocks the power gate signal and transistor 415 pulls the BUFFER B ENABLE signal to a logic high (i.e., disabled) while mode A is selected.

Pad input select circuit 301 can be configured to select from any desired number of input pads by duplicating the pull-down device 403, 413, transmission gate 404, 414 and transistor 405, 415 as well as providing multiple MODE SELECT signals to independently control each pad under control of the pad input select signal.

Referring to FIG. 5, the PADA, BUFFER A ENABLE, and MODE A SELECT lines are coupled to a buffer/output portion of input pad select circuit 301. Similarly, the PADB, BUFFER B ENABLE, and MODE B SELECT lines are coupled to the buffer/output portion of input pad select circuit 301. Transistors 501 and 502 form a buffer for the PADA signal. One source/drain of p-channel transistor 501 is coupled to $V_{cc}$ and the gate of transistor 501 is coupled to the PADA signal. The output of transistor 501 is provided on the second source/drain terminal of transistor 501. Transistor 502 is preferably an N-channel transistor having a first source/drain terminal coupled to ground or $V_{ss}$ and a second source/drain terminal coupled to output node 510. Node 510 is an output node of input pad select circuit 301 and is coupled to internal circuitry of IC 101.

The BUFFER A ENABLE line is coupled to control the gates of p-channel transistor 503 and n-channel transistor 504. When the BUFFER A ENABLE line is a logic high, transistor 503 is off creating a high impedance between the output node of transistor 501 and output node 510. As set out hereinbefore, the BUFFER A ENABLE signal is pulled to a logic high when MODE A SELECT is a logic low. Also, the PADA signal is pulled to a logic low by pull-down device 403 shown in FIG. 4 when the MODE A SELECT signal is a logic low. The logic low PADA signal turns off transistor 502. Hence, when the MODE A SELECT signal is a logic low all of the transistors coupled directly to output node 510 from pad A are off. This minimizes the parasitic capacitance presented by the pad A buffer circuit (i.e., transistors 501–505) while pad A is unselected.

When the MODE A SELECT signal is a logic high, transistor 505 is on and the PADA signal follows the signal on input pad A shown in FIG. 4. Also, when the MODE A SELECT signal is high the BUFFER A ENABLE signal follows the power gate signal shown in FIG. 4. In the case that the BUFFER A ENABLE is a logic high, transistor 504 place pulls output node 510 low through transistor 505. In the case that the BUFFER A ENABLE is a logic low, transistor 503 couples the output of transistor 501 to output node 510, hence, node 510 is under the control of input pad A shown in FIG. 4.

In a similar manner, transistors 511, 512, 513, 514, and 515 selectively couple the PADB signal to output node 510 while MODE B SELECT is high and BUFFER B ENABLE is low. While MODE B SELECT is low, all transistors directly coupled to node 510 in the B buffer are off and in a high impedance state to avoid loading node 510. Any number of output buffer/driver circuits such as shown in FIG. 5 can be used for each input pad under control of input pad selector circuit 301 so long as only one is selected.

FIG. 6 illustrates a portion of particular embodiment of the present invention in a input pad select circuit 301 shown in FIG. 3. The circuit portion shown in FIG. 6 is used to select either the by-8 CAS or the by-16 LCAS for output to the modified LCAS' signal to timing and control signal generator 302. The circuit portion shown in FIG. 6 is substantially duplicated to enable selection of either the by-8 CAS or the by-16 UCAS to generate the modified UCAS') to timing and control signal generator 302 as shown in FIG. 3.

While the by-8 SELECT line is high, the by-16 SELECT line is low. Hence, when the by-8 SELECT line is high, the by-16 LCAS pad is pulled low as described hereinbefore. Transistors 612, 613, and 615 are turned off to prevent loading of node 610 while the by-16 SELECT line is low. In contrast, transistor 605 is on, and transistor 603 is turned on under control of the by-8 CAS BUFFER ENABLE signal. The by-8 CAS BUFFER ENABLE signal is under control of a power gating signal, if used.

While the by-8 SELECT line is high, transistors 601 and 602 that make up the by-8 input buffer are responsive to a signal on the input pad designated to receive the active-low by-8 CAS signal. The signal at node 610 is thus controlled by the by-8 CAS signal when by-8 CAS BUFFER ENABLE is low, and is pulled to a logic low by transistor 604 when the by-8 CAS BUFFER ENABLE is high. In the particular implementation shown in FIG. 6, node 610 is the inverse of the signal on the selected input pad because transistors 601 and 602 form an inverting buffer.

While the by-8 SELECT line is low, the by-16 SELECT line is high. Hence, when the by-16 SELECT line is high, the active-low by-16 LCAS pad is pulled low as described hereinbefore. Transistors 602, 603, and 605 are turned off to prevent loading of node 610 while the by-8 SELECT line is low. In contrast, transistor 615 is on, and transistor 613 is turned on under control of the by-16 CAS BUFFER ENABLE signal. The by-16 CAS BUFFER ENABLE signal is under control of the power gating signal, if used.

While the by-16 SELECT line is high, transistors 611 and 612 that make up the by-16 input buffer are responsive to a signal on the input pad designated to receive the active-low by-16 CAS signal. The signal at node 610 is thus controlled by the by-16 CAS signal when the by-16 CAS BUFFER ENABLE is low, and is low by transistor 614 when the by-16 CAS BUFFER ENABLE is high. In the particular implementation shown in FIG. 6, node 610 is the inverse of the signal on the selected input pad because transistors 611 and 612 form an inverting buffer.

Signal conditioning circuitry 620 affects the delay and edge characteristics of the output UCAS' signal in a conventional manner and can be implemented in any manner appropriate for a particular application. The modified output enable signal OE' (L) is generated by NOR gate 621 having a first node coupled to node 610 and a second node coupled to receive the active-high output enable signal (OE) from an output enable buffer (not shown). The OE signal is supplied to IC 101 through and external pin in the industry standard package for either an by-8 or by-16 configuration.

Although the invention has been described and illustrated with a certain degree of particularity, it is understood that the present disclosure has been made only by way of example. Numerous changes in the combination and arrangement of parts can be resorted to by those skilled in the art without departing from the spirit and scope of the invention, as hereinafter claimed. For example, the present invention is useful in any semiconductor device for which the input signals to a particular path change or are selected based on the devices configuration mode or bond option. Accordingly, these and other are equivalent to the embodiments specifically disclosed herein.

We claim:

1. A configurable memory device comprising:

an array of memory cells arranged in a plurality of rows and columns;

a control circuit receiving a plurality of address and control signals and generating a plurality of row select signals to selected rows in the array, a plurality of column select signals to selected columns in the array, and timing signals;

a first input receiving node capable of receiving a first external signal;

a second input receiving node capable of receiving a second external signal;

an input select circuit having data inputs coupled to the first and second input receiving nodes, and an output coupled to provide one of the address and control signals to the control circuit, wherein the input select circuit includes a select device coupled to receive a mode select signal, the input select circuit being responsive to the mode select signal to couple a selected one of the first and second input receiving nodes to the output of the input select circuit; and a pull-down device responsive to the mode select signal to couple the unselected one of the first and second input pads to a power supply voltage.

2. The configurable memory device of claim 1 further comprising an enable device responsive to the mode select signal to provide a high impedance between the unselected one of the first and second input receiving nodes and the output.

3. The configurable memory circuit of claim 1 wherein the select device comprises a third input receiving node coupled to a power supply terminal.

4. The configurable memory circuit of claim 1 wherein the input select circuit comprises:
   a first buffer having an input coupled to the first input receiving node and an output responsive to a signal on the first input receiving node;
   an enable input node, wherein the first buffer is responsive to the enable input node to provide a high impedance between the first input receiving node and the first buffer output; and
   a second buffer having an input coupled to the second input receiving node and an output responsive to a signal on the second input receiving node, wherein the second buffer is responsive to the enable input node to provide a high impedance between the second input receiving node and the second buffer output, wherein the output node of the input select circuit is coupled to the outputs of the first and second buffers.

5. The configurable memory circuit of claim 4 wherein the first buffer further comprises:
   an n-channel transistor having a first source/drain electrode coupled to the output node of the input select circuit, a second source/drain electrode coupled to ground, and a gate electrode;
   a p-channel transistor having a first source/drain electrode coupled to Vcc, a second source/drain electrode coupled to the output node of the input select circuit, a gate electrode coupled the first input receiving node, and coupled to the gate of the n-channel transistor.

6. The configurable memory circuit of claim 1 wherein the pull down device comprises:
   a first p-channel transistor coupling the first input receiving node to the power supply voltage under control of a first control signal;
   a second p-channel transistor coupling the second input receiving node to the power supply voltage under control of a second control signal;
   combinatorial logic coupled to receive the mode select signal and generate the first and second control signals.

7. An input device comprising:
   an input pad capable of receiving an input signal;
   a mode select node providing a mode select signal;
   a pull-down device coupled to the input pad for pulling the input pad to a first logic state under control of the mode select signal;
   a first n-channel transistor pulling an output of the input device to the first logic state under control of the input pad;
   a first p-channel transistor having an output under control of the input pad, wherein the output of the first p-channel transistor is pulled to a second logic state when the input pad is in the first logic state;
   a power gate node for providing a power gate signal;
   a second p-channel transistor having an output coupling the output of the input device to the output of the first p-channel transistor under control of the power gate signal
   a second n-channel transistor having an output under control of the power gate signal, wherein the output of the second n-channel transistor is pulled to the first logic state when the power gate signal is in the second logic state; and
   a third n-channel transistor having an output coupling the output of the second n-channel transistor to the output of the input device under control of an inverted form of the mode select signal.

8. The input device of claim 7 further comprising a transmission gate coupled to the power gate node for coupling an external power gate signal to the power gate node under control of the mode select signal.

9. The input device of claim 7 wherein when the mode select signal is in the first logic state the output of input device is responsive to the input signal, and when the mode select signal is in the second logic state all of the transistors directly coupled to the output node of the input device are turned off.

10. A configurable input device for an integrated circuit having a plurality of input pads, the input device comprising:
    a plurality of buffers, wherein each buffer is associated with one of the input pads and each buffer receives a mode select signal, wherein the buffer is responsive to the mode select signal to place the buffer in an enabled mode or a disabled mode;
    a receiver portion within each buffer coupled to the associated input pad, the receiver portion pulling the associated input pad to a preselected logic state while the buffer is in the disabled mode;
    an output driver within each buffer, the output driver generating an output signal responsive to a signal on the associated input pad while the buffer is in the enable mode and providing a high impedance while the buffer is in the disabled mode, and
    an output node coupled to the output drivers of the plurality of buffers.

11. The input circuit of claim 10 further comprising combinatorial logic receiving a control signal and generating the mode select signal to each buffer.

12. The input circuit of claim 11 wherein the combinatorial logic generates the mode select signal such that no more than one of the plurality of buffers is in the enabled mode.

13. The input circuit of claim 10 wherein the output driver comprises:
    an n-channel transistor having a source/drain electrode coupled to the output node, a second source/drain electrode coupled to ground, and a gate electrode;
    a p-channel transistor having a first source/drain electrode coupled to a first logic state, a second source/drain electrode coupled to the output node, a gate electrode coupled to one of the plurality of pads, and coupled to the gate of the n-channel transistor.

14. The input circuit of claim 13 wherein the output driver further comprise a high impedance switch coupled between the p-channel s/d and the output node, the high impedance switch being responsive to the mode select signal to selectively couple the p-channel s/d to the output node.

15. A method for configurably coupling an input pad to an internal circuit node of an integrated circuit comprising the steps of:
    providing a plurality of input pads on an integrated circuit;
    providing a mode select signal on a mode select node;
    coupling a selected one of the plurality of input pads to an internal circuit node in response to the mode select signal; and
    controlling a pull-down device to pull the unselected input pads to a first logical state in response to the mode select signal.

16. The method of claim 15 wherein the first logical state is represented by a ground voltage potential.

17. The method of claim 15 further comprising the steps of:

receiving a power gate signal on a power gate node; and controlling impedance between the unselected input pads and the internal circuit node in response to the power gate signal in combination with the mode select signal.

18. The method of claim 15 further comprising the steps of:

receiving a power gate signal over a power gate node; and placing all transistors having outputs coupled to the internal circuit node in a high impedance state in response to the power gate signal in combination with the mode select signal.

* * * * *